United States Patent
Stephan et al.

(10) Patent No.: US 9,389,265 B2
(45) Date of Patent: Jul. 12, 2016

(54) METHOD AND APPARATUS FOR REDUCING INTERFERENCE IN ELECTRICAL LOCATING OF A BURIED CABLE SHEATHING FAULT

(71) Applicant: Hagenuk KMT Kabelmesstechnik GmbH, Radeburg (DE)

(72) Inventors: Marco Stephan, Tauscha (DE); Marco Kuettner, Dresden (DE); Rainer Purschwitz, Dresden (DE)

(73) Assignee: Hagenuk KMT Kabelmesstechnik GmbH, Radeburg (DE)

( * ) Notice: Subject to any disclaimer, the term of this patent is extended or adjusted under 35 U.S.C. 154(b) by 315 days.

(21) Appl. No.: 13/955,241

(22) Filed: Jul. 31, 2013

(65) Prior Publication Data

US 2014/0062497 A1    Mar. 6, 2014

(30) Foreign Application Priority Data

Sep. 4, 2012   (DE) .......................... 10 2012 017 869

(51) Int. Cl.
*G01R 31/08*     (2006.01)

(52) U.S. Cl.
CPC .............. *G01R 31/08* (2013.01); *G01R 31/083* (2013.01)

(58) Field of Classification Search
CPC .............................. G01R 31/083; G01R 31/08
See application file for complete search history.

(56) References Cited

U.S. PATENT DOCUMENTS

| | | | | |
|---|---|---|---|---|
| 4,560,922 A | * | 12/1985 | Heller | H02H 7/265 324/521 |
| 4,710,705 A | * | 12/1987 | Kawabata | G01R 31/1254 324/102 |
| 5,600,248 A | * | 2/1997 | Westrom | G01R 31/088 324/522 |
| 6,819,115 B1 | | 11/2004 | Keefe | |
| 2002/0071508 A1 | * | 6/2002 | Takada | H04B 1/71 375/346 |
| 2004/0117815 A1 | * | 6/2004 | Kondo | G10L 17/26 725/12 |
| 2005/0206371 A1 | * | 9/2005 | Tsukamoto | G01D 5/2451 324/207.21 |
| 2007/0297536 A1 | * | 12/2007 | Yui | H04L 25/06 375/319 |

FOREIGN PATENT DOCUMENTS

| | | |
|---|---|---|
| AT | 413 771 | 5/2006 |
| DE | 101 33 987 | 2/2003 |
| DE | 600 29 233 | 7/2007 |

* cited by examiner

*Primary Examiner* — Jeff Natalini
(74) *Attorney, Agent, or Firm* — W. F. Fasse

(57) ABSTRACT

A method and an apparatus are provided to reduce or eliminate interference signals that have been additively superimposed on a useful signal for locating a cable sheathing fault of a buried electrical cable. A correction unit includes a filter, a delay device and/or a DC component estimator. The correction unit automatically determines a transient interference signal and a DC offset voltage component that have been superimposed on the useful signal as received in an input signal of the correction unit, and then subtracts these determined interference signals from the input signal to provide the interference-free or interference-suppressed useful signal as the output.

15 Claims, 3 Drawing Sheets

METHOD AND APPARATUS FOR REDUCING INTERFERENCE IN ELECTRICAL LOCATING OF A BURIED CABLE SHEATHING FAULT

PRIORITY CLAIM

This application is based on and claims the priority under 35 USC 119 of German Patent Application 10 2012 017 869.7, filed on Sep. 4, 2012, the entire disclosure of which is incorporated herein by reference.

FIELD OF THE INVENTION

The invention relates to the field of locating a cable sheathing fault of a buried electrical cable by analyzing an electrical signal detected from the ground. More particularly, the invention relates to a method and an apparatus for reducing interference when performing such electrical locating of a sheathing or jacket fault of a buried cable.

BACKGROUND INFORMATION

When a buried electrical cable suffers a fault, such as a partial break or rupture, of its cable sheathing or jacket, electrical current will "leak" out of the cable through the cable sheathing fault into the ground. It is thus necessary to repair such a fault, for which the fault must be located and then exposed for access and repair by excavating the ground at a proper location at and around the fault location. Various techniques exist for electrically locating such a cable sheathing fault, to exactly localize the position of the fault, so that the smallest possible area of the cable must be dug-out or excavated.

For example, to carry out such a cable sheathing fault location, it is known to use an electrical signal generator or transmitter to apply a pulsed DC voltage between the cable shielding conductor and the ground potential. As a result, current will flow from the cable shielding conductor through the cable sheath or jacket fault at the location of the fault out into the ground, and then through the ground back to the ground potential connection of the electrical signal transmitter. Due to the electrical resistance of the ground, and the current flowing through it, a voltage funnel is formed in the ground at the cable sheathing fault location. This produces a characteristic voltage pattern emanating through the ground from and around the cable fault location. Thus, using a measuring device with ground probes such as ground spikes that are driven into the ground for achieving a galvanic coupling, it is possible to measure this voltage pattern or voltage signal in the ground. As one approaches the fault location above the cable, the voltage that is measurable at the ground surface increases toward the voltage source, i.e. the fault location. Then, very close to the location above the cable fault the voltage drops off and becomes zero directly above the fault location. Then, moving along the cable after the fault location, i.e. in the direction opposite and away from the voltage signal transmitter connection, the voltage switches polarity, e.g. becomes negative.

In the above fault locating method, the problem often arises that interference voltages are additively superimposed on the useful signal that is to be measured, and thereby impair the measurement. For example, especially problematic in that regard are exponentially decaying transient interferences, which arise, for example, when sticking the ground probes or ground spikes into the ground. Such a transient interfering voltage signal can be many times greater in amplitude than the pulsed DC voltage that is to be measured as a useful signal. Thereby, the time constant of the interference spikes or pulses is typically significantly greater than the period of the pulsed DC voltage. Thus, measurements made during the signal decay time are not valid. According to the current state of the art, this problem is addressed by two methods.

A first known method involves applying a high pass filtering, for example in the simplest case an RC high pass filter. The time constant of such a high pass filter is typically significantly smaller or shorter than the period of the pulsed DC voltage. As a result, the RC high pass filter performs as a differentiator. Thus, if the pulsed DC useful signal is a square or rectangular wave signal, this leads to a voltage reversal or alternation at the times of the flanks of the rectangular wave signal. This alternation or reversal makes it difficult or even impossible to accurately recognize the polarity of the voltage signal in the ground being measured. In turn, this means that it is difficult or impossible to accurately identify the direction of the fault location relative to the measurement location.

On the other hand, according to a second method, the user can himself regulate out the applicable offset voltage. In this case the polarity of the measured voltage, and thus the direction of the cable sheathing fault, can be recognized. However, such manual "regulating-out" of the offset voltage is not very easy, and thus requires great experience and/or skill of the user. Furthermore, especially the abovementioned transients that arise when the ground probe or spike is stuck into the ground make this type of manual regulation difficult, because the user either must constantly re-regulate the equipment to regulate-out the offset voltage or must wait until the probe insertion transients have decayed, which can take several minutes. Because a great number of measurements may be necessary for the final locating of the cable sheathing fault, such waiting for the probe insertion transients to decay after each new insertion of the ground probe leads to a measurement process that is very time consuming overall.

SUMMARY OF THE INVENTION

In view of the above, it is an object of the invention to improve a method and an apparatus for locating a sheathing fault of a buried cable, in comparison to the prior art, in order to reduce or remove the interference signals from an input signal that is detected from the ground and is to be analyzed, and in order to thereby improve the ability to recognize and evaluate the useful measured signal. It is a further object of the invention to speed-up the overall fault locating process by reducing or avoiding the need to wait for interference transients to decay before taking a measurement. The invention further aims to avoid or overcome the disadvantages of the prior art, and to achieve additional advantages, as apparent from the present specification. The attainment of these objects is, however, not a required limitation of the claimed embodiments of the invention.

The above objects have been achieved in an embodiment of a method and an apparatus according to the invention for reducing or removing interference signals that are additively superimposed on a useful signal for locating a cable sheathing fault on a buried cable.

An embodiment of the apparatus comprises a signal input, a signal output and a correction unit. An input signal is applied to the signal input, whereby this input signal includes an interference signal, which especially includes a transient interference signal or a DC voltage, additively superimposed on a measured useful signal resulting from a transmitted signal that was applied to the cable and the ground. In an embodiment, the transmitted signal is preferably a pulsed DC signal, and a time constant of the interference signal is especially greater than the period of the transmitted signal. The correction unit automatically determines a correction signal and applies or superimposes this on the input signal, or otherwise determines and produces the useful signal. Thus, as a result, the useful signal or at least an approximate yet improved recreation thereof is output via the signal output.

Thus, in the above manner the interference signals can be "filtered out" in the measurement technique. This in turn leads to a significantly quicker locating of the cable sheathing fault, which then enables a quicker correction or repair of the cable sheathing fault.

The "input signal" especially corresponds to the voltage signal measured with the ground probes or ground spikes of the measuring equipment, and thus represents the voltage pattern in the ground around the cable sheathing fault. Furthermore, the input signal includes a useful component representing the transmitted signal, and at least one additional component representing an interference signal additively superimposed thereon.

A "useful signal" is the portion or component of the measured input signal from which the measuring apparatus or the user thereof can reach a conclusion about the direction and/or location of the cable sheathing fault. In the ideal case, the useful signal corresponds to the transmitted signal, whereas in an actual case it is also possible that signal distortions of the transmitted signal can arise in the useful signal.

A "signal input" of the apparatus is an input connection or port at which the input signal is applied. This signal input can additionally comprise a sample-and-hold circuit or a signal conditioning circuit to carry out a pre-conditioning of the input signal.

A "signal output" of the apparatus is an output connection or port at which the output signal is provided, which especially is the useful signal that has been "cleaned" of, i.e. separated from, the interference signal. In other words, the useful signal is recovered from the input signal by removing or reducing the interference, and the recovered useful signal is then provided at the signal output.

Both the signal input as well as the signal output can respectively be hardware components or also software representations of the apparatus. For example, the respective value of a signal present at a virtual signal input or signal output can be stored in or provided to a corresponding location in a hardware memory or a hardware address of a physical or virtual memory structure. Any type of memory structure is suitable.

A "correction unit" encompasses an electrical circuit that automatically "cleans" (removes or reduces) the interference signal from the input signal present at the signal input. For example, the correction unit can especially comprise a field programmable gate array (FPGA) circuit or a micro controller circuit, which is respectively programmed or equipped with a suitably set-up software or hardware or combined software and hardware realization to execute a suitable correction algorithm as disclosed herein. All of the components can be embodied in analog and/or digital hardware, and/or in software.

A "transmitted signal" is especially an alternating voltage signal that is applied between the shielding conductor of the cable and the ground potential of the ground. Preferably the transmitted signal is a negative pulsed DC voltage signal with a square wave or rectangle wave signal form.

An "interference signal" is especially any signal that is additively superimposed on the transmitted signal in the measured input signal. Thus, an interference signal especially can include transient signals, for example especially as such transient signals arise when sticking the ground probe or ground spike of the equipment into the ground. Furthermore, the interference signal may include other interference signal components that have relatively long interference signal time constants, also called decay time constants. In this regard, a "long" time constant means that the respective interference signal component has not yet completely decayed to the extent necessary for validly carrying out the measuring procedure, within one period of the transmitted signal, called the transmitted signal period.

A "correction signal" is especially a signal produced or established by the correction unit, whereby this correction signal is "subtracted" from the input signal so that in an ideal case the additive interference signal would be eliminated. Thus, in the ideal case the correction signal corresponds to the interference signal. The term "subtracting" in the present case also encompasses a filtering-out of the interference signal, so that the actual transmitted signal remains. Namely, the concept of subtracting a correction signal can mean either producing a correction signal and subtracting it from the input signal, or producing an inversion of the interference as the correction signal and adding it to the input signal, or filtering the input signal so as to remove the interference signal, so that the transmitted signal remains. A signal combining node is any hardware or software adapted to add or subtract a negative or positive correction signal.

Alternatively, the correction unit can "generate" or "produce" the useful signal. This encompasses such cases in which the transmitted signal has been determined by a suitable algorithm or by suitable measurement technology and procedures, and has then been provided at the signal output for example by a suitable adjustable voltage source. It also encompasses a software representation of the value of the useful signal. Thus, this software value may then be further processed, for example by means of software and associated hardware.

In order to provide the simplest possible and most economical circuitry for eliminating the interference signal, the correction unit may comprise a low pass filter, especially a moving average or mean value filter, an FIR (finite impulse response) filter and/or an IIR (infinite impulse response) filter, which determines or eliminates frequent components of the useful signal.

The correction unit may comprise a delay device, which delays the input signal in time, in order to compensate for a time delay occurring through the filter. Thus, the delay device is arranged generally in parallel with the filter so that the input signal experiences the same delay through the delay device as it does through the filter.

Furthermore the correction unit may comprise a DC voltage component estimator, for example especially embodied as a median filter, which applies (especially through subtraction) the estimated DC voltage component to the input signal for eliminating the DC component from the input signal, especially after the signal has already been cleaned or filtered of the transient interference as mentioned above.

In a further aspect of the invention, the above objects have been achieved in a cable sheathing fault locating apparatus that comprises a signal transmitting device, a measuring device and an apparatus according to the invention as disclosed herein. Thus, an embodiment of the invention provides an apparatus for locating a cable sheathing fault, whereby this apparatus directly comprises a correction unit as disclosed herein, so that appropriate corrections of the measured signals are carried out directly and automatically in the apparatus while carrying out the process for locating a cable sheathing fault.

The terms "signal transmitting device" and "measuring device" refer to any conventionally known devices or apparatuses for transmitting an electrical signal and for measuring signals for determining the location of a sheathing fault of a cable, involving the measurement of potential differences on the ground surface or in a shallow depth range of the surface as probed by ground spikes or the like above the area of a cable sheathing fault along a buried cable. Furthermore, those devices or apparatuses can be further improved and supplemented according to the invention, and especially are also provided in combination with the correction unit according to the invention. In a further embodiment the measuring device includes at least two ground spikes, probes or electrodes. Thereby, a vector indicating the direction toward the location of the cable sheathing fault can be determined.

In order to achieve an especially effective automatic correction, a value of a transmitting signal period of the signal transmitting device is provided to the correction unit or is determined in the correction unit.

BRIEF DESCRIPTION OF THE DRAWINGS

In order that the invention may be clearly understood, it will now be described in further detail in connection with example embodiments thereof, with reference to the accompanying drawings, wherein.

DETAILED DESCRIPTION OF PREFERRED EXAMPLE EMBODIMENTS AND OF THE BEST MODE OF THE INVENTION

Figure 1:
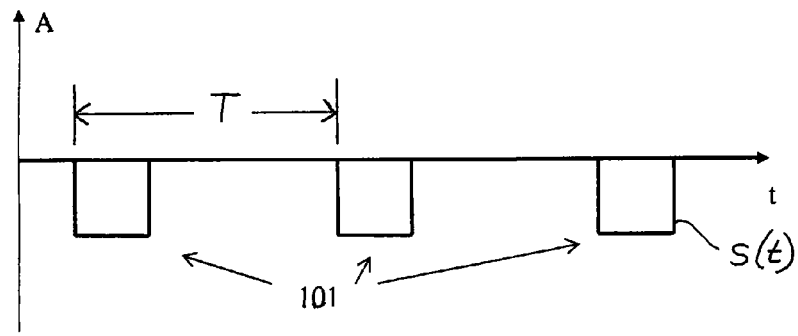
FIG. 1 is a schematic signal diagram of the voltage progression of a negative pulsed DC voltage as applied between a cable shielding conductor and the ground.
Figure 8:
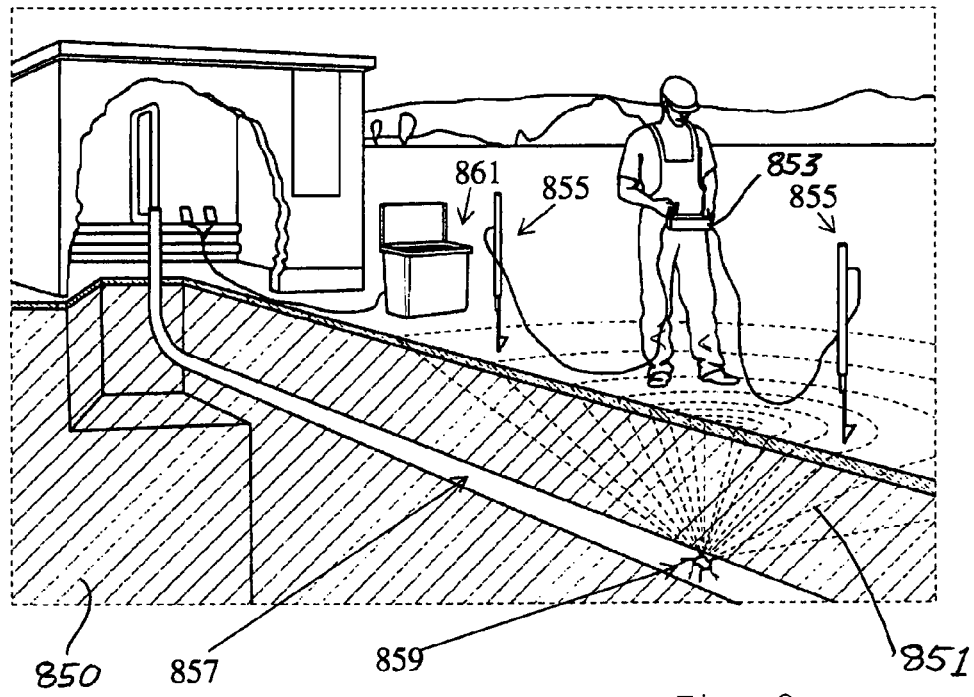
FIG. 8 is a schematic sectioned perspective view of a worker using equipment according to the invention for locating a cable sheathing fault of a cable buried in the ground, by measuring a potential or voltage field in the ground using ground probes or spikes.

Referring to FIG. 8, a medium voltage cable 857 that is buried in the ground 850 has a cable sheathing fault 859 that leaks an electric current from the cable into the ground 850. In order to locate the cable sheathing fault 859, for then excavating and repairing the cable 857 at this location, a pulsed DC voltage transmission signal s(t) with a square or rectangular waveform is generated by a DC voltage generator 861 and is applied between the shielding conductor (or some other conductor of the cable) of the cable 857 and the ground 850 or earth at the ground potential. FIG. 1 represents the amplitude A over time t, of the negative pulsed DC transmission signal pulses 101 of the transmission signal s(t) with a pulse period T, as produced by the DC voltage generator 861.

Arising from the voltage signal applied to the cable 857, a current flows from the cable shielding conductor through the cable sheathing at the fault 859 into the ground 850, and then flows through the ground to the ground potential connection of the signal generator or transmitter 861. Due to the electrical resistance of the ground 850 and the current flowing through the ground, this causes the formation of a voltage funnel 851 at the location of the fault 859 (see FIG. 9). The voltage field 971 or pattern of this voltage funnel 851 at the ground surface or a shallow depth within the ground 850 near the surface can be measured by a potential measuring device through galvanic coupling with the ground by ground probes or spikes 855 that are driven into the ground and connected for electrical conduction with the measuring device 853.

Figure 9:
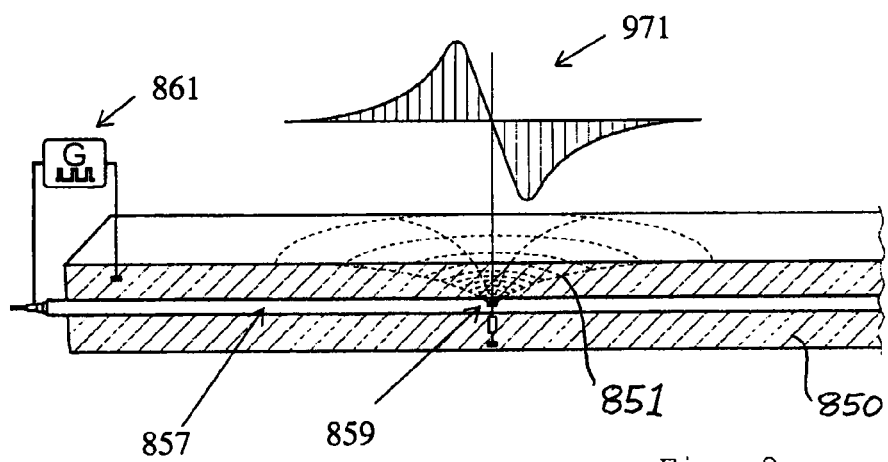
FIG. 9 is a schematic sectioned side view and a signal diagram representing the voltage progression in the ground in an area above a cable sheathing fault of a buried cable.

FIG. 9 represents the voltage funnel 851 originating from the cable sheathing or jacket fault 859 of the cable 857 in the ground 850, due to the voltage signal s(t) applied by the voltage signal generator or transmitter 861. FIG. 9 also represents a voltage signal diagram of the step voltage 971 of the voltage funnel 851 as can be measured at the surface of the ground 850 with the probes 855. The voltage 971 increases as the measuring location approaches from the signal generator 861 toward the location of the fault 859, then decreases and becomes zero directly above the cable sheathing fault 859, and then reverses polarity on the other side of or after passing the location of the cable sheathing fault 859. Thus, by measuring the voltage potential at the ground surface, it is possible to locate the cable sheathing fault 859 based on the voltage pattern of the step voltage 971. These measurements are taken by inserting the ground spikes 855 into the ground.

Figure 2:
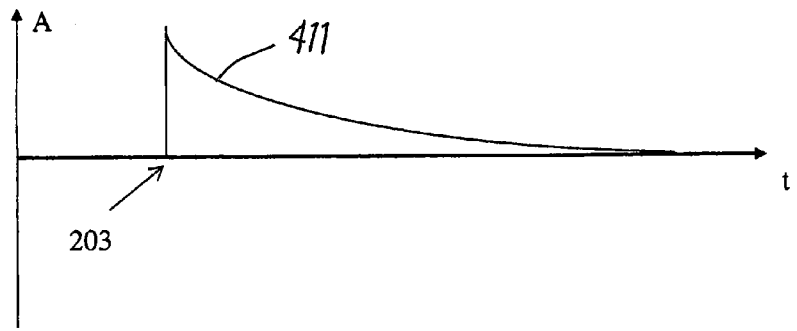
FIG. 2 is a schematic signal diagram representing the voltage progression of a transient interference signal that arises due to inserting a ground spike into the ground.
Figure 4:
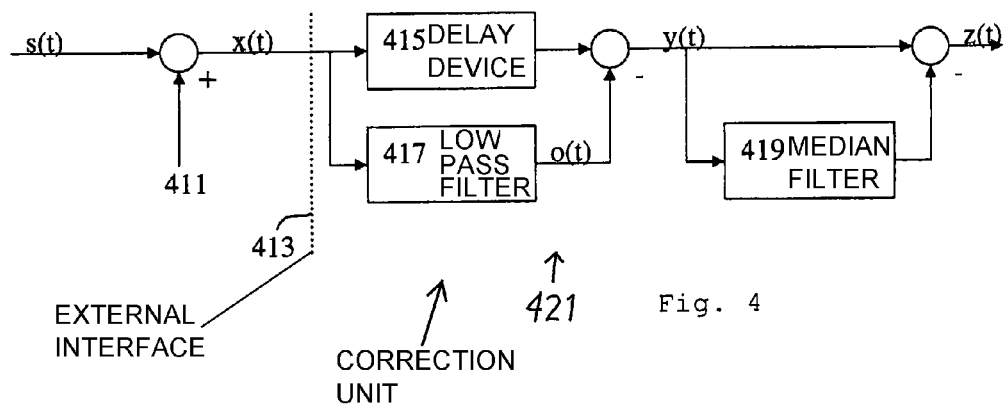
FIG. 4 is a schematic functional block diagram of an embodiment of a correction apparatus according to the invention.

However, as represented by a signal diagram of amplitude A over time t in FIG. 2, when inserting one or more ground spikes 855 into the ground at a time point 203, this gives rise to transient interference signals 411 comprising a sudden voltage rise or spike followed by a transient decay of the voltage level. The decay time constant of the transient interference 411 is typically greater than the transmission signal period T of the transmission signal s(t) as can be seen by comparing FIG. 2 with FIG. 1. As the applied input signal s(t) leaks out of the cable at the sheathing fault 859 into the ground, the transient interference voltages 411 are additively superimposed on the square or rectangular pulses 101 of the transmitted signal s(t) to result in a compound input signal x(t) that is received or detected by the ground spikes 855 and measured by the measuring device 853. This additive superposition of the intended transmitted signal s(t) with the interference voltages 411 to produce the input signal x(t) is represented in FIG. 4. This figure further represents a correction unit 421 according to an embodiment of the invention, which is incorporated in or connected before an input of the measuring device 853. Reference number 413 represents an external interface or connection to an input of the correction unit 421, for example via the ground spikes 855 of the measuring device 853, for sensing the potential level in the ground as the input signal x(t).

Figure 3:
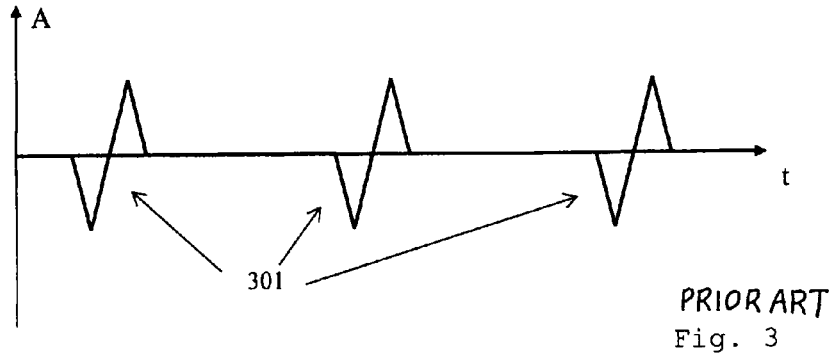
FIG. 3 is a schematic signal diagram of the voltage progression of a signal that has been processed using a high pass filter according to the prior art.

The transient interference 411 superimposed on the transmitted signal s(t) makes it more difficult to measure and evaluate the transmitted signal. Thus, efforts have been made to remove or separate the interference from the intended useful signal. For example, in the prior art, a high pass filter has been used to eliminate such interferences 411 from the detected input signal, whereby such high pass filtering produces a resultant signal 301 as represented in FIG. 3. In that regard, the time constant of the high pass filter is smaller or shorter than the pulse duration. As can be seen in FIG. 3, the filtering allows the sharp voltage transitions or edges of the transmitted signal pulses 101 to be detected, but there is not a clean or accurate representation of the pulses 101 of the transmitted signal s(t). Furthermore, it is disadvantageous that such conventional high pass filtering causes an alternation or reversal of the polarity of the resulting output signal, which makes it significantly more difficult to recognize the true polarity of the input signal. Therefore, with such a filtered signal it is difficult or impossible to obtain an accurate conclusion about the location and direction of the cable sheathing fault 859, because it is difficult or impossible to recognize the polarity reversal in the step voltage 971 as represented in FIG. 9 upon making successive measurements at locations along the cable.

Accordingly, an embodiment of the present invention aims to provide a different manner of evaluating the received input signal x(t) that is detected by measurements of the ground surface potential as recorded by the measuring device 853 via the ground spikes 855 as described above. The input signal x(t) is predominantly a superposition of the pulsed transmission signal s(t) applied by the DC voltage generator 861 as shown in FIG. 1, with the transient interference signal or signals 411 as shown in FIG. 2, which arise when a ground spike 855 is inserted into the ground 850 as shown in FIG. 8. Furthermore, in the signal processing, a DC offset voltage must be accounted for, and an embodiment of the invention provides a solution whereby an offset voltage o(t) is automatically generated from the input signal x(t) of a receiver.

An embodiment of the invention solves the problem in the automatic signal processing, that a useful signal negatively influences or impairs a generating of the offset voltage. For this reason, it is suggested to use a filter that is able to effectively eliminate the useful signal, yet that leaves an offset interference signal effectively uninfluenced to the extent possible.

In a first alternative embodiment according to the invention, the abovementioned filter comprises a low pass filter 417 that effectively eliminates the useful signal yet passes the remaining offset voltage o(t) to its output. A Fourier series expansion of a rectangular or square wave signal with an arbitrary sampling or pulse ratio shows that the useful signal consists of a DC component $A_{DC}$ as well as the frequencies $f_g=1/T_p$.

Thus, the following equation pertains:

$$s(t) = A_{DC} + \sum_{k=1}^{\infty} A_{+k} \cdot e^{j \cdot 2 \cdot \pi \cdot k \cdot f_g} + A_{-k} \cdot e^{-j \cdot 2 \cdot \pi \cdot k \cdot f_g}$$

Figure 5:
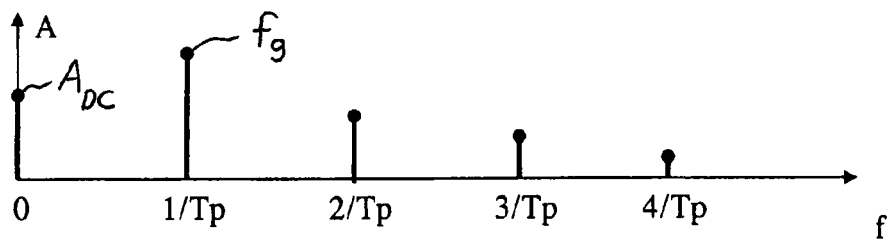
FIG. 5 is a schematic diagram representing the amplitude spectrum of the useful signal.

As shown in FIG. 5, the frequency spectrum of the useful signal is discrete, i.e. includes discrete frequency components, namely consists of a DC component $A_{DC}$, a fundamental or base frequency $f_g$, which corresponds to the inverse of the signal period $T_p$, as well as multiples or harmonics of the fundamental frequency.

If the DC component is left outside in front, then the solution in a moving average filter 417 as the low pass filter 417 of order N is according to this characteristic under certain conditions. Its transfer function is:

$$H_{MA}(z) = \frac{1}{N+1} \sum_{n=0}^{N} z^{-n}$$

Furthermore this leads to the frequency response:

$$H_{MA}(\Omega) = \frac{\sin((N+1) \cdot \Omega)}{(N+1) \cdot \Omega} \cdot e^{-j\Omega N/2} \text{ wherein } \Omega = \pi \frac{f}{f_a}$$

dependent on the normalized angular frequency $\Omega$, which is determined by the ratio of the frequency f relative to the sampling or pulse frequency $f_a$. The frequency response shows that the amplitude response of the filter describes or represents a sinc-function, and further produces a delay of N/2 samples.

The null points in the frequency response of the filter lie at multiples of:

$$(N+1) \cdot \pi \cdot \frac{f}{f_a} = i \cdot \pi \text{ wherein } i = 1; 2; 3; \ldots$$

Because the signal frequencies are to be canceled or eliminated, the filter must have null points at the frequencies:

$$f_{Null} = \frac{k}{T_p} \text{ wherein } k = 1; 2; 3; \ldots$$

As a result, the following equation pertains for the filter order:

$$N = \frac{i}{k} f_a \cdot T_p - 1 \text{ wherein } i = 1; 2; 3; \ldots \text{ and } k = 1; 2; 3; \ldots$$

Because the filter order N shall be a natural number, the sampling or pulse frequency $f_a$ is a whole multiple of the base or fundamental frequency $f_g$ of the signal so that the null points lie exactly at the frequencies of the useful signal. If only the useful signal is present at the input of the receiver, then the following equation pertains:

$$o(n) = h_{MA}(n) * x(n) = h_{MA}(n) * s(n) = A_{DC} \text{ for } N = \frac{i}{k} f_a \cdot T_p - 1$$

Only a constant term that corresponds to the DC component of the useful signal remains leftover. In order to ensure the shortest or quickest possible starting transient response time of the filter, the filter order is selected as small as possible. The smallest filter order is given with i=1 and k=1.

Accordingly, the minimum possible filter order is given by:

$$N_{Min} = f_a \cdot T_p - 1$$

Thus, this filter comprises a delay of $$\frac{N_{Min}}{2} = \frac{f_a \cdot T_p - 1}{2}$$

samples. Namely, the signal portion that is filtered through the low pass or moving average filter 417 is not only filtered as described above but is also delayed by the abovementioned amount, and is then provided in this form at the output of the filter 417 as the offset voltage signal o(t). For this offset voltage signal o(t) to be accurately subtracted from the original input signal x(t), the original input signal x(t) must be similarly delayed in a delay device 415, for example as schematically shown in FIG. 4. Thus, the delay device 415 in effect compensates or corrects for the delay that is also introduced through the filter 417.

Figure 6:
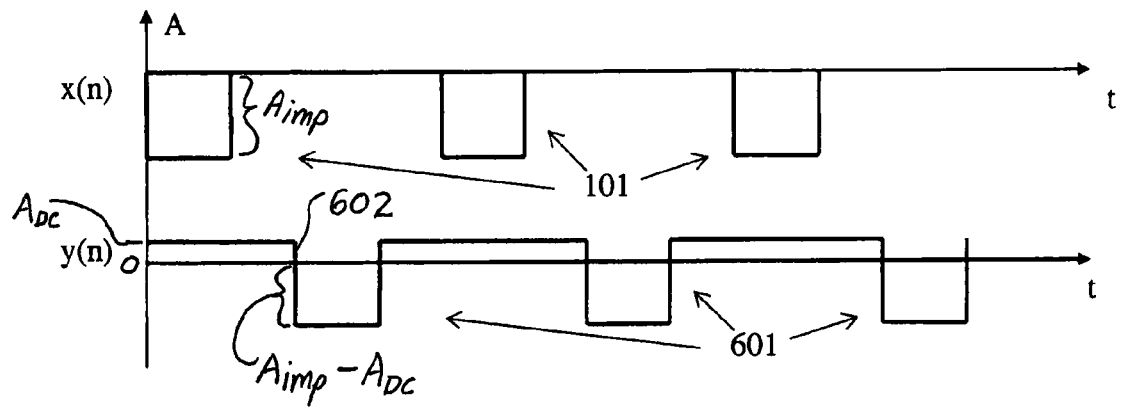
FIG. 6 is a schematic signal diagram of the voltage progression of the input signal (upper diagram) and of an output signal or intermediate signal (lower diagram), which comprises a time delay and an additive superimposed DC voltage component in comparison to the input signal.

Thus, the behavior of the compensation circuit including the filter 417 and the delay device 415 is illustrated in FIG. 6. The upper signal diagram of FIG. 6 shows the input signal x(n) comprising DC voltage pulses 101 having pulse heights or amplitudes $A_{imp}$. The lower signal diagram of FIG. 6 shows the intermediate signal y(n) with signal pulses 601 that arises when the filtered and delayed offset voltage signal o(t) output by the filter 417 is subtracted from the delayed signal output by the delay device or element 415. As can be seen, the intermediate signal y(n) essentially corresponds to the input signal x(n) with a time delay and with a voltage or amplitude offset by the amount of the missing DC component $A_{DC}$ of the useful signal. Namely, while the input signal x(n) has a zero base voltage (e.g. between signal pulses 101) and pulses with a negative amplitude of $A_{imp}$, the intermediate signal y(n) exhibits a positive DC component $A_{DC}$, such that the (negative) magnitude of each pulse is reduced by the DC component $A_{DC}$, i.e. the negative magnitude of each pulse is given by $A_{imp}-A_M$. Furthermore, during the pulse pauses or gaps between successive pulses 601, the intermediate signal y(n) exhibits the new offset component 602 with the amplitude $A_{DC}$.

The following discussion will explain the estimation of the DC component. Because it is troublesome or problematic that the output signal is free of a DC component, now an additional embodiment for estimating the DC component $A_{DC}$ will be explained.

Figure 7:
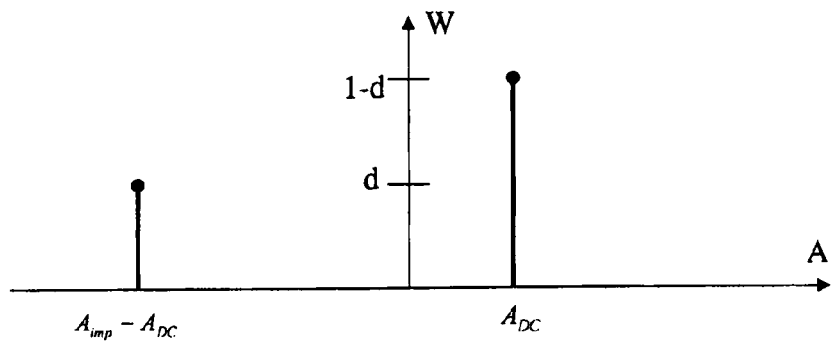
FIG. 7 is a schematic diagram of a probability density function of a compensated useful signal with negative polarity.

FIG. 7 schematically illustrates the probability density function of a DC component-free useful signal with a pulse duty factor d and negative polarity. Namely, FIG. 7 shows the probability W of different signal amplitudes A. The useful signal as can be seen in FIG. 6 comprises two discrete amplitude values. Namely, values of the useful signal with the amplitude $A_{DC}$ arise with a probability W of 1−d. That represents the time probability of the pulse pauses or intervals between pulses. On the other hand, the pulses having an amplitude of $A_{imp}-A_{DC}$ as described above occur with a probability W of d as given by the pulse duty factor d. These two probabilities are shown in FIG. 7. It should also be understood that if a signal with positive polarity was considered instead of the negative polarity signal discussed above, the probability density function would simply be mirror symmetrical about the probability axis relative to the probability density function shown in FIG. 7.

It is preferably required as a condition, that the pulse duty factor d is substantially less than 0.5, i.e. d<<0.5. Thereby, a simple estimator for the DC component $A_{DC}$ can be constructed. In this regard, a sample is selected which represents the DC component $A_{DC}$. Namely, to determine or select this sample, a sample is used that occurs with the probability 1−d. A list of all samples sorted according to the amplitude of the respective samples shows that for d<<0.5, the middle sample in such a list always represents the DC component, and particularly, independently of the polarity of the useful signal.

Therefore, a median value filter or median filter is a suitable estimator 419 for the DC component of the DC component-free useful signal. For example, a median filter as an estimator 419 is shown schematically connected in the circuit in FIG. 4. The estimator 419 estimates or determines the DC component of the intermediate signal y(t) and provides this DC component at its output. The DC component is then subtracted from the intermediate signal y(t) to produce the final output signal z(t), which corresponds to the intermediate signal y(t) after subtraction or removal of the DC component $A_{DC}$. The median filter as the estimator 419 preferably has an order of a multiple of $N_{Min}$ in order to optimally represent the probability density function. In order to ensure the shortest or quickest possible starting transient response time of the median filter, it preferably has the order $N_{Min}$.

In summary, for processing the input signal x(t) that includes interference superimposed on a useful signal that began as the original transmission signal s(t), the correction unit 421 beginning at the input interface 413 includes the low pass filter 417 for eliminating the useful signal from the input signal x(t), as well as a delay device or element 415 for delaying the input signal x(t) correspondingly to compensate for the delay of the filter 417, so that then the offset voltage signal o(t) output by the filter 417 can be subtracted or removed from the delayed output of the delay element 415, to produce the intermediate signal y(t). The correction unit 421 optionally or alternatively additionally comprises the DC component estimator 419 in order to estimate the DC component $A_{DC}$ and then subtract it from the intermediate signal y(t) to produce the final output signal z(t). Thus, after the signal processing described above, the output signal z(t) essentially corresponds to the original transmission signal s(t) without the superimposed interference such as the transient spikes 411.

Although the invention has been described with reference to specific example embodiments, it will be appreciated that it is intended to cover all modifications and equivalents within the scope of the appended claims. It should also be understood that the present disclosure includes all possible combinations of any individual features recited in any of the appended claims. The abstract of the disclosure does not define or limit the claimed invention, but rather merely abstracts certain features disclosed in the application.

What is claimed is:

1. A signal processing apparatus for reducing interference signals that are superimposed on a useful signal for locating a cable fault on a buried electrical cable, comprising:
   an apparatus input adapted to receive an input signal including interference signals superimposed on a useful signal;
   a first filter that has an input thereof connected to said apparatus input, and that is adapted to at least partially filter the useful signal out of the input signal to produce a filtered signal at an output of said first filter;
   a delay device that has an input thereof connected to said apparatus input, and that is adapted to time-delay the input signal to produce a delayed signal at an output of said delay device;
   a first signal combining node that has inputs respectively connected to said output of said first filter and said output of said delay device, and that is adapted to combine the filtered signal and the delayed signal so as to produce a first combined signal at an output of said first signal combining node, wherein the first combined signal at least partially includes the useful signal and at least partially omits the interference signals;
   a DC component estimator that comprises a median filter, and that has an input thereof connected to said output of said first signal combining node, and that is adapted to produce an estimated DC component signal at an output of said DC component estimator; and a second signal combining node that has inputs respectively connected to said output of said first signal combining node and said output of said DC component estimator, and that is adapted to combine the first combined signal and the estimated DC component signal so as to produce a second combined signal at an output of said second signal combining node.

2. The signal processing apparatus according to claim 1, wherein said first signal combining node is adapted to combine the filtered signal and the delayed signal by subtracting the filtered signal from the delayed signal to produce the first combined signal.

3. The signal processing apparatus according to claim 1, wherein said first filter imposes an amount of time delay on the filtered signal relative to the input signal, and wherein said delay device is adapted to time-delay the input signal by said amount of time delay to produce the delayed signal.

4. The signal processing apparatus according to claim 1, wherein said first filter comprises a low pass filter.

5. The signal processing apparatus according to claim 1, wherein said first filter comprises a moving average filter.

6. The signal processing apparatus according to claim 1, wherein said first filter comprises at least one of an FIR filter and an IIR filter.

7. The signal processing apparatus according to claim 1, wherein said second signal combining node is adapted to combine the first combined signal and the estimated DC component signal by subtracting the estimated DC component signal from the first combined signal to produce the second combined signal.

8. A cable fault locating apparatus, comprising:
said signal processing apparatus according to claim 1;
a signal transmitting device that comprises a pulsed DC voltage generator and that is adapted to apply a pulsed DC voltage as the useful signal between a buried electrical cable and a ground in which the electrical cable is buried; and
a measuring device that includes at least one ground electrode adapted to make conductive contact with the ground to detect the input signal or a precursor thereof;
wherein said measuring device is connected to said apparatus input of said signal processing apparatus and is adapted to provide the input signal to said apparatus input.

9. The cable fault locating apparatus according to claim 8, wherein said measuring device includes at least two said ground electrodes comprising at least two ground spikes.

10. The cable fault locating apparatus according to claim 8, wherein said measuring device includes a signal conditioning or pre-processing circuit adapted to condition or pre-process the precursor of the input signal so as to produce the input signal.

11. A signal processing apparatus for reducing interference signals that are superimposed on a useful signal for locating a cable fault on a buried electrical cable, comprising:

an apparatus input adapted to receive an input signal including interference signals superimposed on a useful signal;

a low pass filter that has an input connected to the apparatus input, and that has a filter characteristic adapted to at least partially filter the useful signal out of the input signal and to impose a time delay amount;

a signal delay device that has an input connected to said apparatus input, and that is adapted to impose a time delay corresponding to the time delay amount;

a first node connected to, and adapted to subtractively combine, outputs of said low pass filter and said signal delay device;

a median filter having an input connected to an output of said first node; and a second node connected to, and adapted to subtractively combine, said output of said first node and an output of said median filter.

12. A method of locating a cable fault on an electrical cable buried under ground, comprising the steps:
a) applying an electrical transmitted signal between the cable and the ground;
b) detecting an electrical input signal from the ground, wherein the input signal includes the transmitted signal and interference superimposed thereon;
c) filtering the input signal to produce a filtered signal from which the transmitted signal has been at least partially removed;
d) time-delaying the input signal to produce a delayed signal that exhibits a time delay relative to the input signal;
e) subtracting the filtered signal from the delayed signal, to produce an improved signal including the transmitted signal and at least partially omitting the interference;
f) median-filtering the improved signal to produce an estimated DC component signal; and
g) subtracting the estimated DC component signal from the improved signal to produce an output signal.

13. The method according to claim 12, further comprising evaluating the improved signal or a further processed version thereof, and repeating said steps a) to e) and said evaluating, for said detecting in said step b) carried out at successive locations along the ground, to locate the cable fault based on changes of a result of said evaluating at said successive locations.

14. The method according to claim 12, further comprising evaluating the output signal, and repeating said steps a) to g) and said evaluating, for said detecting in said step b) carried out at successive locations along the ground, to locate the cable fault based on changes of a result of said evaluating at said successive locations.

15. The method according to claim 12, wherein said detecting is performed with at least two electrodes making conductive contact with the ground.

* * * * *